United States Patent
Joshi

(10) Patent No.: US 7,471,083 B1
(45) Date of Patent: Dec. 30, 2008

(54) APPARATUS AND METHOD FOR SHOWING THAT A MAGNETIC FIELD PRODUCES A COUPLE AND NOT A FORCE

(76) Inventor: Ramesh L. Joshi, 48900 Crown Ridge Common, Fremont, CA (US) 94539

( * ) Notice: Subject to any disclaimer, the term of this patent is extended or adjusted under 35 U.S.C. 154(b) by 0 days.

(21) Appl. No.: 11/972,566

(22) Filed: Jan. 10, 2008

(51) Int. Cl.
*G01R 33/12* (2006.01)
*G01R 33/02* (2006.01)

(52) U.S. Cl. ...................... 324/244; 324/260

(58) Field of Classification Search ......... 324/173–174, 324/228, 244, 260–261; 250/306
See application file for complete search history.

(56) References Cited

U.S. PATENT DOCUMENTS

| | | | |
|---|---|---|---|
| 1,735 A | 8/1840 | Cook | |
| 1,143,529 A | 6/1915 | Garretson | |
| 2,650,344 A * | 8/1953 | Lloyd | 324/232 |
| 4,293,815 A | 10/1981 | West et al. | |
| 4,414,285 A | 11/1983 | Lowry et al. | |
| 5,681,987 A * | 10/1997 | Gamble | 73/105 |
| 6,794,863 B2 | 9/2004 | Hatanaka | |
| 6,977,505 B1 | 12/2005 | Rosenquist | |
| 7,038,450 B2 | 5/2006 | Romalis et al. | |
| 2006/0219324 A1 * | 10/2006 | Ozawa | 148/100 |

* cited by examiner

*Primary Examiner*—Bot LeDynh
(74) *Attorney, Agent, or Firm*—Craig M. Stainbrook; Stainbrook & Stainbrook, LLP

(57) ABSTRACT

An apparatus for observing magnetic phenomena including a nonferrous planar platform, a cylinder disposed upright on the platform, magnets placed on the platform at the lower end of the cylinder, specimen suspending means disposed at the upper end of the cylinder, ferrous and nonferrous specimens selectively connected to the specimen suspending means when the other specimen is not so connected, a shaft disposed through opposing holes in the side of the cylinder, and biasing means disposed inside the cylinder between the specimen suspending means and the shaft.

14 Claims, 4 Drawing Sheets

FIG. 1A  FIG. 1B

APPARATUS AND METHOD FOR SHOWING THAT A MAGNETIC FIELD PRODUCES A COUPLE AND NOT A FORCE

CROSS REFERENCES TO RELATED APPLICATIONS

Not applicable. The present application is an original and first-filed United States Utility patent application.

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION-BY-REFERENCE OF MATERIAL SUBMITTED ON A COMPACT DISC

Not applicable.

BACKGROUND OF THE INVENTION

1. Field of the Invention

The present invention relates generally to magnetometers, electromagnetism and the study of magnetic fields and more particularly to an apparatus and method for the observation of magnetic phenomena, including the observation that the magnetic field produces a couple.

2. Discussion of Related Art

The apparatus described in the instant disclosure demonstrates that the magnetic field produces a couple and not a force, as conventionally believed and currently taught in physics. In this vein, a "couple" is understood to mean a pair of forces acting on parallel lines, equal in magnitude, opposite in directions, and at a finite distance that is non-zero and is known in physics as the "arm" of the couple. The apparatus of the present invention deals with the qualitative and quantitative measurements of magnetic field. The measurement criteria are a function of both displacement and time consumed per displacement. The invention thus enables measurement of the most desired perpendicular magnetic field as opposed to existing methods which work on the force due to magnetic field; existing methods are limited by measuring only the horizontal field, as the horizontal field produces a force which is easily measurable. Furthermore, the existing method deals with the magnetic forces. By contrast, the apparatus of the present invention measures the couple developed by the magnetic field. This method of measurement has been developed in view of quantum mechanics, but is not disclosed in either classical physics or known treatments of quantum mechanics.

Magnetic fields have been known for millennia. Current theories in physics view the magnetic and electric fields as different aspects of a single phenomenon called electromagnetism. Reducing electric and magnetic fields into a single electromagnetic field does not reveal, but rather conceals, the fundamental properties and differences of the fields of these phenomena. The geometrical characteristics of these three fields when experimentally observed have completely irreconcilable orientations with respect to their surroundings, and have different geometrical relationships to space, time and matter.

In 1820 Hans Christian Oersted discovered that an electric current produces a magnetic field causing a deflection in a magnetic needle when it flows over the needle. In 1831 at the Royal Institute of London, Michael Faraday experimentally observed that a magnetic field induces an electric current in a (copper) coil. At roughly the same time and independently, Joseph Henry in America and Heinrich Lenz in Russia discovered the same experimental results related to electric and magnetic fields.

In 1832 Carl Friedrich Gauss built upon these discoveries to engineer a magnetometer consisting of a bar magnet suspended from a gold thread. Using an improved apparatus of the same essential design, he was eventually able to measure the Earth's magnetic field.

Gauss also introduced a law related to magnetic flux. The Gauss magnetic flux law states: "The net magnetic flux through any (real or imaginary) closed surface is zero." The magnetic flux through an element of area perpendicular to the direction of magnetic flux is a measure of magnetic quantity equal to the product of the magnetic field and the area element scalar.

In 1865, James Clark Maxwell unified the experimental results of Coulomb, Gauss Oersted, Faraday, Ampere and others into a set of four equations, known as the Maxwell's Electromagnetic Field Equations.

In one essential aspect, the present invention functions as a magnetometer similar to the one developed by Gauss, though it reveals residual magnetic properties neither observed nor reported either in early works or in current physical theories. Gauss's earliest magnetometer contained an element consisting of a bar magnet suspended from a gold thread. The present invention improves upon Gauss's magnetometer by introducing novel structures and features. These additional structures and features include, but are not limited to, a clear cylinder, the location of the magnets within the cylinder, and a suspended ferrous metal horseshoe. Additionally, a preferred embodiment of the present invention alters the shape of Gauss's bar magnet to that of a more effective horseshoe shape. While the prior art does utilize horseshoe magnets in other types of magnetometers, it does not suggest the use of a suspended horseshoe magnet, or ferrous metal horseshoe specimen as an improvement for Gauss's bar magnet. [See U.S. Pat. No. 1735, to Cook; and U.S. Pat. No. 1,143,529 to Garretson.]

Furthermore, the present invention manually maneuvers a suspended ferrous material in a cylinder also containing the source of a magnetic field. Gauss's magnetometer, on the other hand, was housed in a large room and was designed to detect a magnetic source outside the housing structure, most famously, the Earth's magnetosphere. Furthermore, unlike Gauss's early magnetometer, which was not easily assembled, moved, or resembled, the apparatus of the present invention is transportable and easily disassembled and reassembled.

Many other types of magnetometers are found in the prior art. Well known examples of later developed magnetometers include the fluxgate, Overhauser, and atomic magnetometers. [Cf., U.S. Pat. Nos. 4,293,815; 6,977,505; and 7,038,450.] However, all of these later magnetometers utilize structures and innovations other than a manually maneuvered suspended ferrous material for detecting magnetic fields.

The attractive and repulsive behavior of magnetic poles are presently treated as being similar to the phenomena related to electric charges. This similarity between the magnetic and electric fields ends only at the attractiveness and repulsiveness; it does not appear to be inherent in these fields, and it can not be extended to an isolated magnetic pole, which does not exist in the way that an isolated electric charge exists. If a bar of magnet is broken into two pieces, two isolated north and south poles do not occur; rather, the pieces maintain distinct north and south poles. If the process of breaking is continued, isolated north and south poles are still never created.

One of the fundamental properties satisfying the Maxwell's equations and the Gauss flux law is that the magnetic field is space dependent, which is not the case for an electric field. A magnetic field is produced due to the motion of an unpaired electrons in an atom (of ferrous) matter with specific orientation. To produce a magnetic field, there must be a minimum of two unpaired electrons in an atom (or molecule), both at a finite distance in the atomic/molecular orbit, and those unpaired electrons must have specific orientations which nullify the electric fields of the two electrons. In the magnetic field, the space separation of the minimal two unpaired electrons and their space separation dependency cannot be reduced to zero. This is the unique property of the magnet and magnetic phenomena. There is no similar space dependency in the electric (and gravitational) field(s).

To show a geometrical picture of the anomalous property of the magnetic filed, we limit our discussion to two unpaired electrons, such as might appear in a Nickel atom (which can be extended to more than two unpaired electrons without a loss of generality). These two unpaired electrons, at a finite distance and in motion, nullify the electric fields under certain conditions and produce local magnetic fields at the atomic level, with north and south poles orientations.

Under a normal condition, most unpaired electrons in an atom are unoriented but have a domain of magnetic boundaries with local magnetic fields randomly oriented and so, nullify the fields' effects, resulting in zero net magnetization. When an external magnetic field is applied to the material, boundaries between the magnetic domains move and produce an observable permanent magnetic field. The north and south poles are located along the applied field, creating a permanent magnet. According to the Gauss law, with no motion in the produced permanent magnet, the magnetic field lines do not start and stop at any point in the space, but form closed loops issuing from the north pole and returning through the south pole.

Now, the forces associated with the magnetic field lines in the neighborhood of one of the poles, say north pole, are perpendicular to the field lines, are at the same distance apart as the electrons in the atomic structure. They also oppose each other and form a couple, like a spur gear structure. This structure is permanent for a permanent magnet.

As we move away from the poles, the couple structure gets weaker; the couple reduces to two forces, where the forces are opposites and are far away, appearing as pair of individual forces. These forces are weakest in the middle of the two poles of the magnet. However, when a permanent magnet is broken into two pieces, there appear new magnetic phenomena with newly added north and south poles and a force field structure associated with the poles.

A similar force structure also exists in material with two unpaired electrons. To easily observe the gear-and-tooth structure, a horseshoe specimen may be provided. When the horseshoe specimen is brought into proximity in front of a permanent magnet, it produces an induction in the specimen, and when given an up and down motion in the neighborhood of a pole, it rotates as if it is moving with a spur gear. The inventive apparatus reveals the couple force structure in the rotational motion of the horseshoe specimen.

BRIEF SUMMARY OF THE INVENTION

The present invention is an apparatus and a method for the study of magnetic phenomena. The novel apparatus of the present invention is an improvement Gauss's earliest magnetometer. It is easily portable and capable of detecting the magnetic fields of objects placed within a cylinder. Additionally, it does not require a connection to an external electrical power source.

In a preferred embodiment, the present invention includes a transparent cylindrical chamber with one or several magnets are placed at the lower end of the cylinder. A ferrous iron (or cobalt, or nickel, or any material with unpaired electrons) horseshoe is suspended from a dowel and lowered into the cylinder. A spring within the cylinder allows for controlled and smooth movement of the suspended horseshoe specimen.

As the iron horseshoe is maneuvered up and down the interior of the cylinder, the magnetic field of the magnets and the magnetic flux of the moving ferrous material create a magnetic induction causing the horseshoe to rotate. The strength of the magnetic field can be observed by the proportional rate of rotation of the horseshoe as the horseshoe is itself maneuvered at a constant rate. In this manner, the apparatus of the present invention is a novel magnetometer and demonstrates that the magnetic field produces a couple.

Other novel features which are characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawings are for illustration and description only and are not intended as a definition of the limits of the invention. The various features of novelty that characterize the invention are pointed out with particularity in the claims annexed to and forming part of this disclosure. The invention does not reside in any one of these features taken alone, but rather in the particular combination of all of its structures for the functions specified.

There has thus been broadly outlined the more important features of the invention in order that the detailed description thereof that follows may be better understood, and in order that the present contribution to the art may be better appreciated. There are, of course, additional features of the invention that will be described hereinafter and which will form additional subject matter of the claims appended hereto. Those skilled in the art will appreciate that the conception upon which this disclosure is based readily may be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE SEVERAL VIEWS OF THE DRAWINGS

The invention will be better understood and objects other than those set forth above will become apparent when consideration is given to the following detailed description thereof. Such description makes reference to the annexed drawings wherein:

FIG. 1 is an exploded perspective view of a preferred embodiment of the cylinder and base used in the present invention, while FIGS. 1A and 1B shows ferrous and non ferrous specimens and suspension apparatus for each;

DETAILED DESCRIPTION OF THE INVENTION

Figure 1:
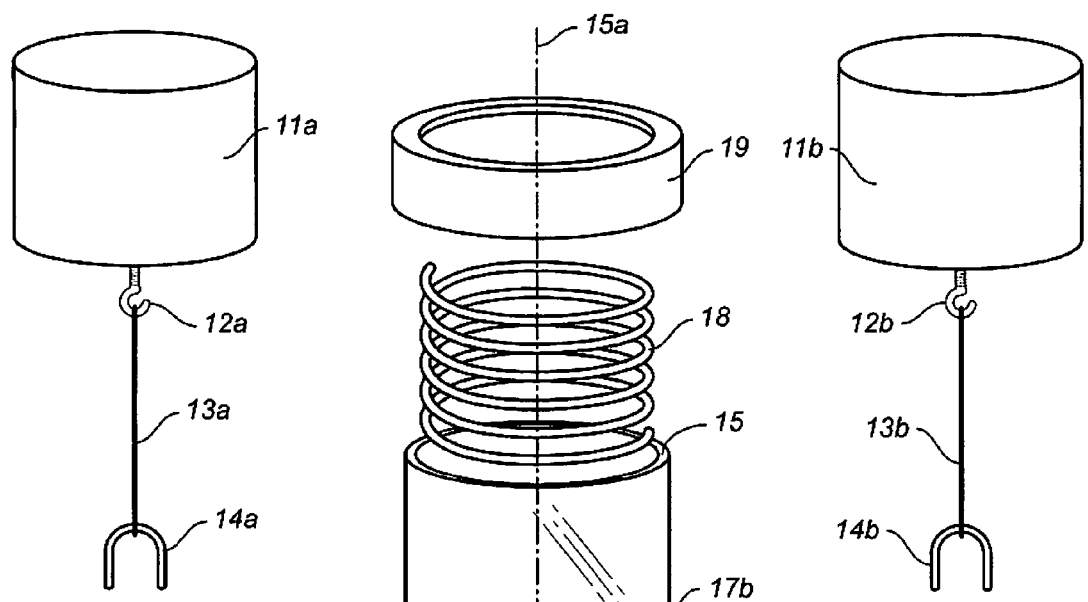
Figure 1:
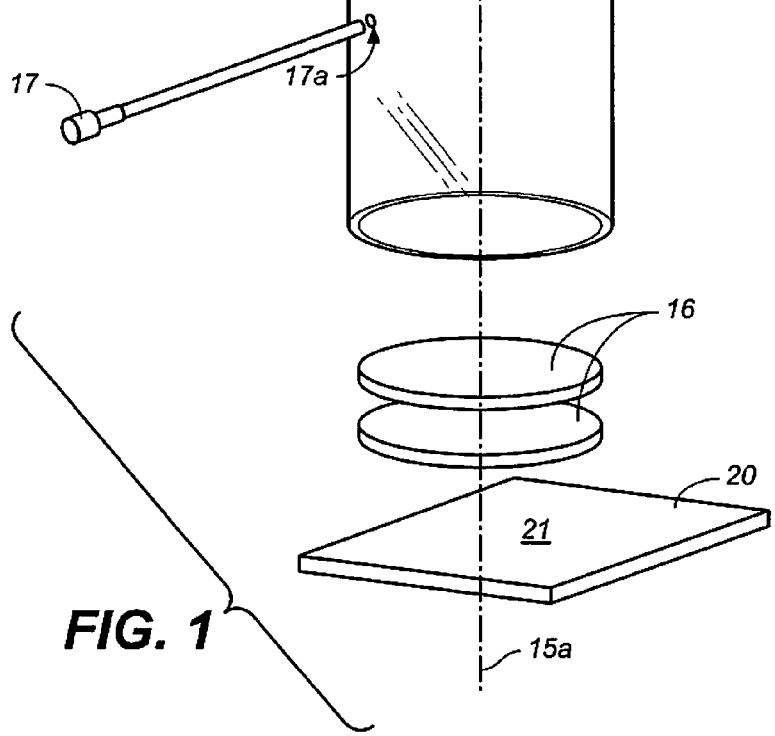
Figure 2:
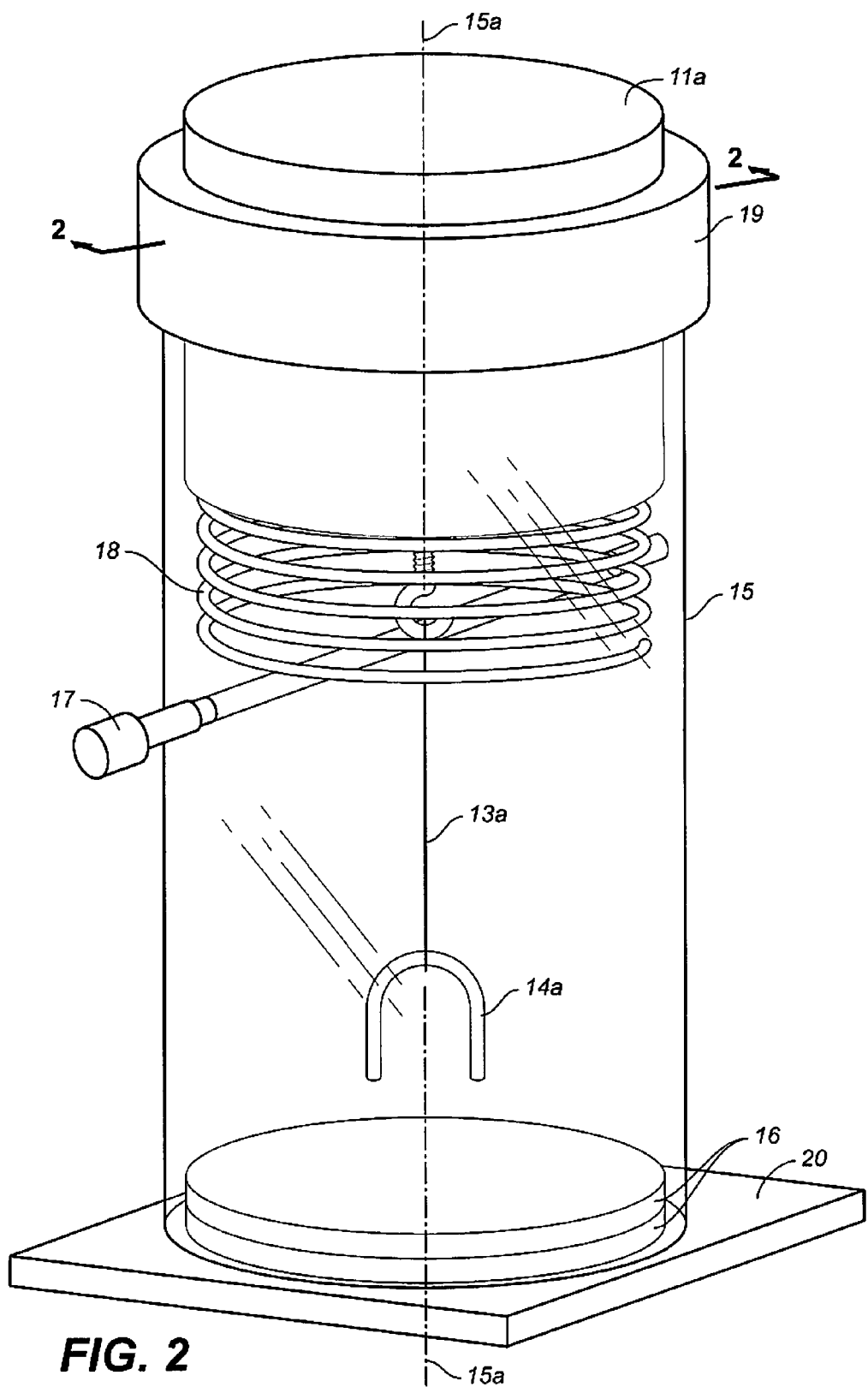
FIG. 2 is a perspective view showing the inventive apparatus fully assembled.
Figure 3:
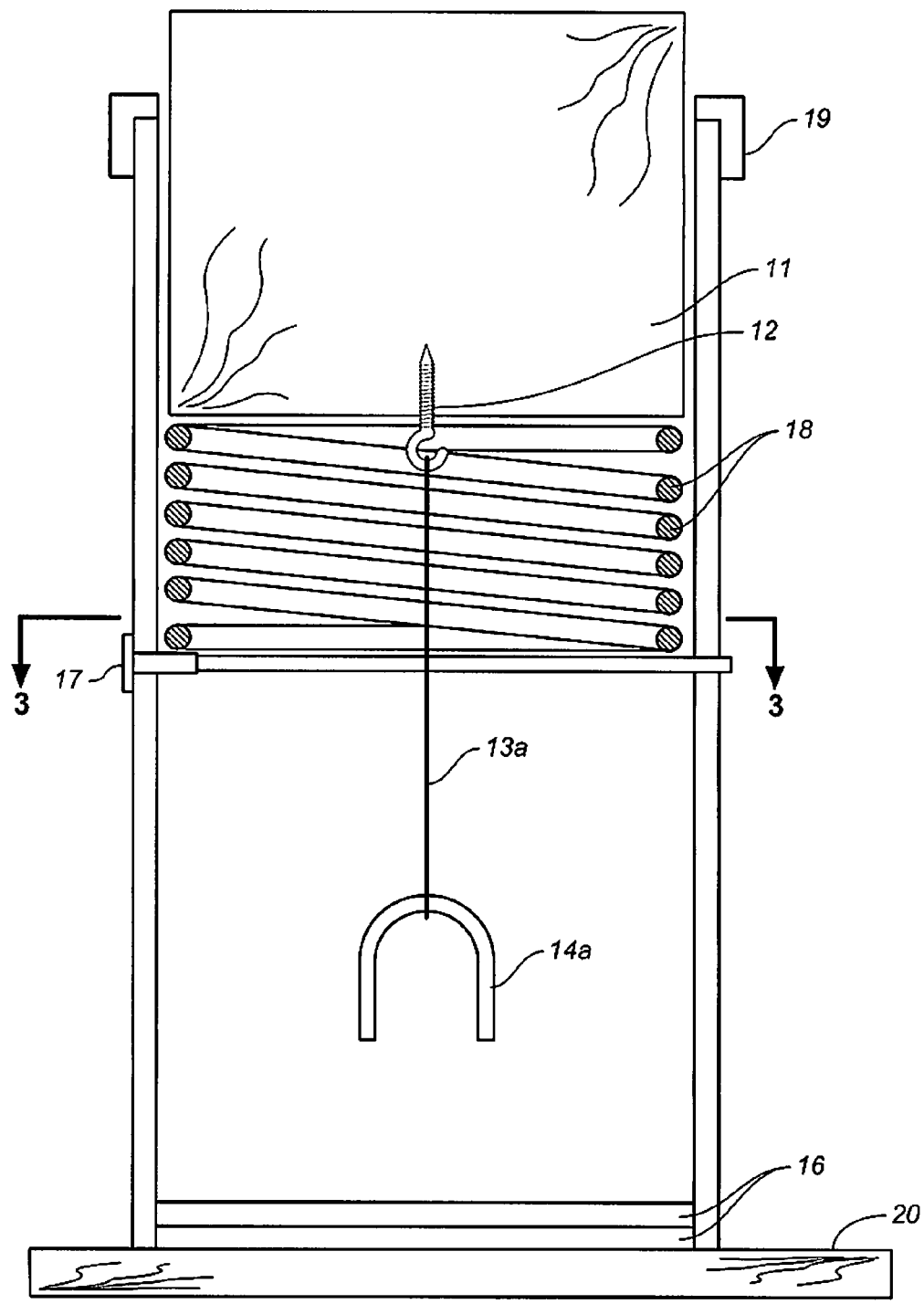
FIG. 3 is a cross-sectional side view in elevation of the apparatus of FIG. 2.
Figure 4:
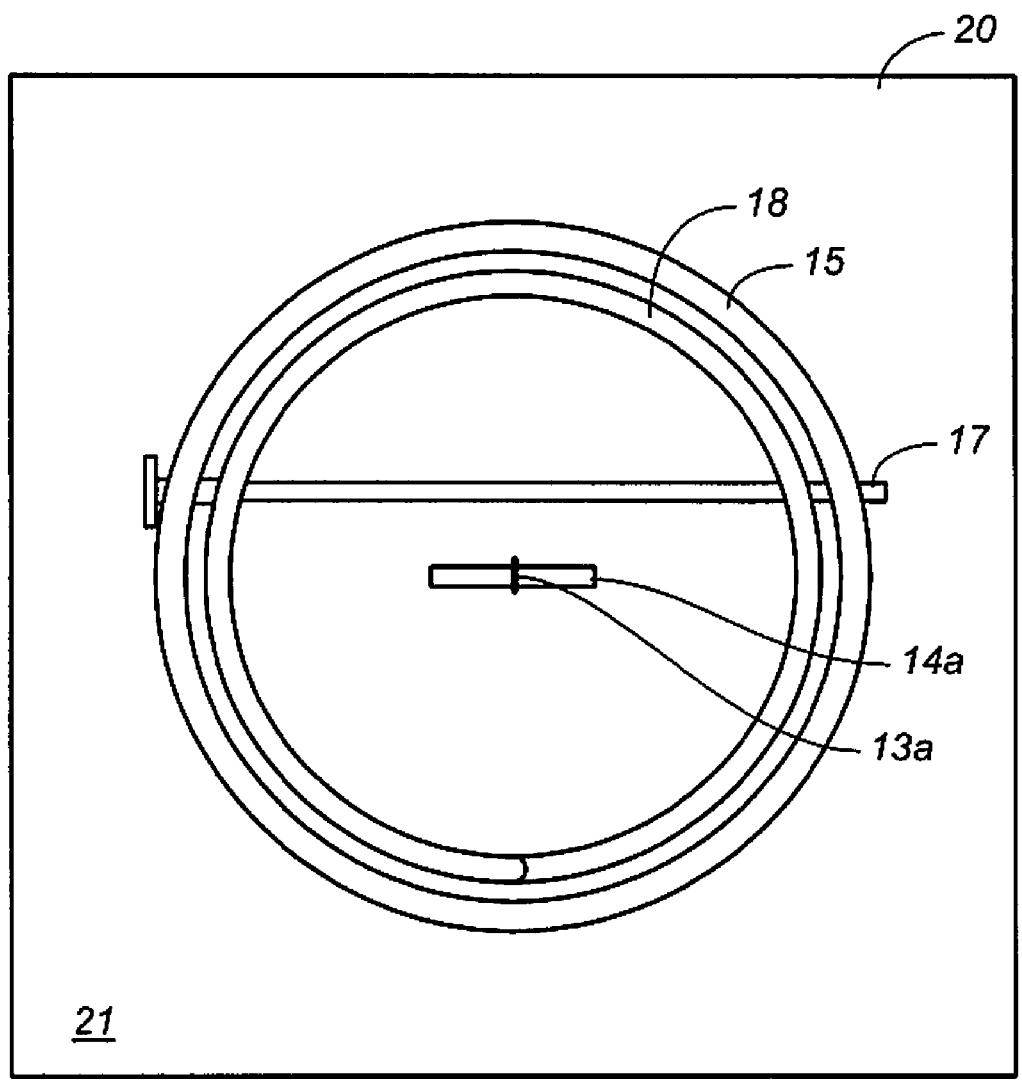
FIG. 4 is a top plan view of the apparatus of FIGS. 2 and 3.

Referring to FIGS. 1 through 4, wherein like reference numerals refer to like components in the various views, there is illustrated therein a new and improved apparatus to demonstrate that a magnetic field produces a couple and not a force. The apparatus is generally denominated 10 herein. The simple assembly includes a hollow cylinder 15 placed in an upright position on a nonferrous base or platform 20, said base having a substantially planar upper surface 21. The cylinder has a longitudinal axis 15a and supports a specimen suspending means 11a/11b, 12a/12b, at least one shaft 17, a ferrous specimen 13a or, alternatively, a nonferrous specimen 13b, and a wire or string 14a/14b. One or more sets of apertures 17a, 17b, are located on opposing sides of the cylinder for insertion of the one or more shafts. The shaft(s) 17 is/are of a length greater than the outer diameter of the cylinder. The apertures are offset from the center of the cylinder to allow the centered suspension of the wire or string. At least one, and preferably a plurality of magnets 16 is placed within the perimeter of contact between the cylinder and the platform. Furthermore, each magnet is placed in such a manner that its magnetic field is aligned perpendicularly to the upper surface of the planar platform.

The suspending means 12 in the preferred embodiment preferably comprises a fixed anchor, such as a hook attached to the underside of dowel or plug 11a/11b generally at the geometric center of the dowel. In each embodiment the dowel is a nonferrous material such as wood, plastic, glass, and the like.

One specimen must consist of a ferrous material such as iron. The other specimen must consist of a nonferrous material such as copper. Each of the specimens preferably has a horseshoe shape. A line of some kind, preferably lightweight string or wire 13a/13b, attaches the specimen to the suspending means 12a/12b.

The shaft 17 is inserted through opposing apertures 17a/17b in the side of the cylinder. A spring 18 or other biasing means is then placed into the interior of the cylinder and disposed in an upright position on the shaft so as to not hinder the insertion of the specimen into the interior portion of the cylinder. The spring supports the dowel to which the anchor or hook 12a/12b is attached.

An annular cap 19 surrounds and further centers the dowel 11a/11b. The cap is concentric with the cylinder and includes an aperture sufficient for the sliding insertion of the dowel to which the specimen suspending means is attached. When placed inside the cylinder, whether or not the cap is included, the geometric center of the dowel is substantially aligned with the longitudinal axis of the cylinder. In operation, therefore, the specimen supporting means suspends a specimen within the interior of the cylinder substantially along the longitudinal axis of the cylinder. The height of suspension is varied by manually manipulating the specimen supporting means (i.e., depressing the dowel and allowing it to spring back up).

A ferrous specimen 13a is then maneuvered (via depression of the dowel) to a position as close to the bottom of the cylinder as possible without touching the magnets. The specimen is allowed to come to a complete rest. The specimen is then maneuvered via manipulation (release of depression) of the dowel in a vertical direction upwards at a rate sufficient to produce magnetic induction of a magnitude capable of rotating the ferrous specimen. The angular velocity of the rotation is proportional to the rate the specimen is maneuvered.

The ferrous specimen is then removed and the process is repeated with the nonferrous specimen 13b. It too is allowed to come to rest, and the vertical position of the nonferrous specimen is then maneuvered at a rate similar to the rate used for the ferrous specimen. However, it will be noted that the identical movement produces neither a magnetic induction nor a rotation in the nonferrous specimen.

The hollow cylinder of the preferred embodiment includes a rigid clear plastic tubular cylinder with an outer diameter of 0.75 inches, an interior diameter of 0.50 inches and a length of 5.75 inches. Two round planar magnets with a thickness of 0.187 inches and a diameter of 0.4966 inches are glued in place to the platform with their magnetic fields in unison and oriented perpendicularly to the platform. The cylinder is placed in an upright position over the magnets such that the magnetic fields are oriented with the center axis of the cylinder.

The ferrous specimen is preferably constructed of a 0.0125 inches diameter and 1.5 inches length iron wire in a horseshoe shape and attached to a specimen suspending means with string of nonferrous material and a diameter of 0.002 inches. The nonferrous specimen is constructed of a 0.0125 inches diameter and 1.5 inches length copper wire in a horseshoe shape and attached to a specimen suspending means with string of nonferrous material and a diameter of 0.002 inches.

The specimen suspending means consists of a 0.48 inches diameter 1.35 inches long wooden dowel with a stainless steel eye inserted into its surface at its axial center. A hook is constructed 0.55 inches diameter wire and has a 0.226 inches diameter eye. The string portion of the specimen is then attached to the hook of a specimen suspending means.

A stainless steel shaft of 0.125 inches is inserted into the apertures at the side of the cylinder. A stainless steel spring of 0.4865 inches outer diameter, 0.3705 inches inner diameter with seven turns each of 1.375 inches in length is then installed in the cylinder. The spring both supports the specimen supporting means and permits the smooth motion of the specimen. The cap is then attached to the top portion of the cylinder securing the spring within the cylinder.

Above noted dimensions, or cylinder shape, or specimen shape can be changed without losses of observations as long as the intent and constrains are maintained, e.g. one can replace the circular cylinder with a clear square box.

As will be immediately appreciated from the foregoing description, in its most essential aspect, the apparatus of the present invention is an improved magnetometer for demonstrating that a magnetic field produces a couple. The essential elements of the preferred embodiments comprise (1) a nonferrous platform having a substantially planar upper surface for mounting a cylindrical chamber; (2) a cylindrical chamber disposed in an upright position on said upper surface of said nonferrous platform, said cylindrical chamber being rigid, hollow, and having a lower end and an upper end; (3) at least one magnet disposed at said lower end of said cylindrical chamber such that the magnetic field of said one or more magnets is perpendicular to said nonferrous platform; (4) a ferrous specimen fabricated from a ferrous material and a nonferrous specimen fabricated from a nonferrous material; (5) specimen suspending means disposed at said upper end of said cylindrical chamber for suspending either one of said ferrous specimen or said nonferrous specimen in a substantially centered position along the longitudinal axis of said cylindrical chamber; and (6) reciprocating means for moving said specimen upward and downward along the longitudinal axis of said cylindrical chamber.

Accordingly, while this invention has been described in connection with the preferred embodiments thereof, it is obvious that modifications and changes therein may be made by those skilled in the art to which it pertains without departing from the spirit and scope of the invention. Accordingly, the scope of the invention is limited only to the appended claims.

Further, the above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Therefore, the above description and illustrations should not be construed as limiting the scope of the invention, which is defined by the appended claims.

What is claimed as invention is:

1. An apparatus for observing magnetic phenomena, including a force couple of the magnetic field, comprising:
   a base having a substantially planar upper surface;
   a cylinder disposed in an upright position on the upper surface of said base, said cylinder being rigid, hollow, having a lower end and an upper end, being open at least at said upper end, and having a pair of opposing apertures disposed in the side of said cylinder;
   at least one magnet placed on said base at said lower end of said cylinder in a manner such that the magnetic field of said at least one magnet is perpendicular to said base;
   specimen suspending means slidingly disposed at said upper end of said cylinder;
   a ferrous specimen fabricated from a ferrous material and a nonferrous specimen fabricated from a nonferrous material, either of said nonferrous specimen and said ferrous specimen selectively connected to said specimen suspending means when the other of said specimens is not connected to said specimen suspending means, whereby the specimen is suspending along the longitudinal axis of said cylinder;
   at least one shaft disposed through the opposing apertures in said cylinder; and
   biasing means disposed inside said cylinder between said specimen suspending means and said shaft.

2. The apparatus of claim 1, wherein said cylinder is fabricated from a transparent plastic material.

3. The apparatus of claim 1, wherein said base is fabricated from nonferrous material.

4. The apparatus of claim 1, wherein each of the magnets of said at least one magnet is round and planar.

5. The apparatus of claim 1, wherein said ferrous specimen has a horseshoe shape.

6. The apparatus of claim 5, wherein said ferrous specimen is made of iron.

7. The apparatus of claim 1, wherein said nonferrous specimen is horseshoe shaped.

8. The apparatus of claim 7, wherein said nonferrous specimen is made of copper.

9. An apparatus of claim 1, wherein said biasing means is a spring.

10. A method for demonstrating that a magnetic field forms a force couple of the magnetic field, comprising the steps of:
    (a) providing a nonferrous planar platform, a rigid hollow cylinder placed on the platform in an upright position, the cylinder being open at both ends and having a pair of opposing apertures in the side of the cylinder, at least one magnet placed on the planar platform at the lower end of the cylinder in a manner such that the magnetic field of each magnets is perpendicular to the planar platform, a specimen suspension means disposed at the upper end of the cylinder, a ferrous specimen fabricated from a ferrous material and connected to the specimen suspending means, a nonferrous specimen fabricated from a nonferrous material and connected to the specimen suspending means when the ferrous specimen is not so connected, and means for reciprocating the specimens upwardly and downwardly along the longitudinal axis of the cylinder;
    (b) inserting the ferrous specimen into the cylinder and suspending it with the specimen suspension means;
    (c) manipulating the specimen suspension means to maneuver the ferrous specimen within the cylinder in an up and down reciprocating manner along the longitudinal axis of the cylinder and observing the movement of the ferrous specimen;
    (d) removing the ferrous specimen from the cylinder and disconnecting it from the specimen suspension means;
    (d) inserting the nonferrous specimen into the cylinder and suspending it with the specimen suspension means; and
    (e) manipulating the specimen suspension means to maneuver the nonferrous specimen within the cylinder in an up and down reciprocating manner along the longitudinal axis of the cylinder and observing the movement of the nonferrous specimen.

11. The method of claim 10, further including the step of using a horseshoe-shaped ferrous specimen to observe the perpendicular magnetic material as a couple.

12. An improved magnetometer for demonstrating that a magnetic field produces a couple, said apparatus comprising:
    a nonferrous platform having a substantially planar upper surface for mounting a cylindrical chamber;
    a cylindrical chamber disposed in an upright position on said upper surface of said nonferrous platform, said cylindrical chamber being rigid, hollow, and having a lower end and an upper end;
    at least one magnet disposed at said lower end of said cylindrical chamber such that the magnetic field of said one or more magnets is perpendicular to said nonferrous platform;
    a ferrous specimen fabricated from a ferrous material and a nonferrous specimen fabricated from a nonferrous material;
    specimen suspending means disposed at said upper end of said cylindrical chamber for suspending either one of said ferrous specimen or said nonferrous specimen in a substantially centered position along the longitudinal axis of said cylindrical chamber; and
    reciprocating means for moving said specimen upward and downward along the longitudinal axis of said cylindrical chamber.

13. The magnetometer of claim 12, wherein said reciprocating means comprises a dowel slidingly disposed at said upper end of said cylindrical chamber.

14. The magnetometer of claim 13, wherein said specimen suspending means comprises a fastener affixed to said dowel and a line connected to said fastener and to said specimen.

* * * * *